United States Patent [19]
Streinz et al.

[11] Patent Number: 6,015,506
[45] Date of Patent: Jan. 18, 2000

[54] COMPOSITION AND METHOD FOR POLISHING RIGID DISKS

[75] Inventors: Christopher C. Streinz, Aurora; Matthew Neville, Geneva; Steven K. Grumbine; Brian L. Mueller, both of Aurora, all of Ill.

[73] Assignee: Cabot Corporation, Boston, Mass.

[21] Appl. No.: 08/844,195

[22] Filed: Apr. 18, 1997

Related U.S. Application Data

[63] Continuation-in-part of application No. 08/753,482, Nov. 26, 1996.

[51] Int. Cl.⁷ .................................................. C09K 13/00
[52] U.S. Cl. ...................... 252/186.1; 216/53; 252/182.1; 252/182.32; 252/183.4; 510/175
[58] Field of Search .......................... 216/53; 252/182.1, 252/182.32, 183.4, 186.1; 510/175

[56] References Cited

U.S. PATENT DOCUMENTS

| | | | |
|---|---|---|---|
| 3,342,652 | 9/1967 | Reisman et al. | 156/17 |
| 3,385,682 | 5/1968 | Lowen | 51/293 |
| 3,429,080 | 2/1969 | Lachapelle | 51/309 |
| 3,668,131 | 6/1972 | Banush et al. | 252/79.4 |
| 3,877,938 | 4/1975 | Shinozaki et al. | 96/29 |
| 3,930,870 | 1/1976 | Basi | 106/3 |
| 4,011,099 | 3/1977 | Gutsche | 134/7 |
| 4,021,263 | 5/1977 | Rosenblum | 106/288 |
| 4,225,349 | 9/1980 | Koshiyama et al. | 106/3 |
| 4,251,384 | 2/1981 | Rooney | 252/147 |
| 4,412,886 | 11/1983 | Sakaguchi et al. | 156/645 |
| 4,426,366 | 1/1984 | McCandlish et al. | 433/365 |
| 4,475,981 | 10/1984 | Rea | 156/636 |
| 4,476,102 | 10/1984 | McCandlish et al. | 423/365 |
| 4,529,410 | 7/1985 | Khaladji et al. | 51/309 |
| 4,581,042 | 4/1986 | Willmore | 51/293 |
| 4,601,755 | 7/1986 | Melard et al. | 106/3 |
| 4,671,851 | 6/1987 | Beyer et al. | 156/645 |
| 4,696,697 | 9/1987 | Kitano et al. | 106/3 |
| 4,769,046 | 9/1988 | Senda et al. | 51/293 |
| 4,789,648 | 12/1988 | Chow et al. | 437/225 |
| 4,885,106 | 12/1989 | Lapham et al. | 252/100 |
| 4,910,155 | 3/1990 | Cote et al. | 437/8 |
| 4,915,710 | 4/1990 | Miyazki et al. | 51/309 |
| 4,929,257 | 5/1990 | Miyazaki et al. | 51/309 |
| 4,935,039 | 6/1990 | Miyazaki et al. | 51/309 |
| 4,944,836 | 7/1990 | Beyer et al. | 156/645 |
| 4,956,015 | 9/1990 | Okajimia et al. | 106/3 |
| 4,956,313 | 9/1990 | Cote et al. | 437/203 |
| 4,959,113 | 9/1990 | Roberts | 156/636 |
| 4,992,135 | 2/1991 | Doan | 156/636 |
| 5,084,071 | 1/1992 | Nenadic et al. | 51/309 |
| 5,114,437 | 5/1992 | Takeuchi et al. | 51/293 |
| 5,137,544 | 8/1992 | Medellin | 51/281 |
| 5,139,570 | 8/1992 | Castrogiovanni et al. | 106/3 |
| 5,157,876 | 10/1992 | Medellin | 51/308 |
| 5,209,816 | 5/1993 | Yu et al. | 156/636 |
| 5,225,034 | 7/1993 | Yu et al. | 156/636 |
| 5,226,955 | 7/1993 | Owaki | 106/3 |
| 5,244,534 | 9/1993 | Yu et al. | 156/636 |
| 5,340,370 | 8/1994 | Cadien | 51/308 |
| 5,354,490 | 10/1994 | Yu et al. | 252/79.1 |
| 5,366,542 | 11/1994 | Yamada et al. | 106/3 |
| 5,387,457 | 2/1995 | Sato | 428/141 |
| 5,391,258 | 2/1995 | Brancaleoni et al. | 156/636 |
| 5,441,788 | 8/1995 | Bloomquist et al. | 428/65.6 |
| 5,469,312 | 11/1995 | Watanabe et al. | 360/103 |
| 5,476,606 | 12/1995 | Brancaleoni et al. | 252/79.1 |
| 5,527,423 | 6/1996 | Neville et al. | 156/636.1 |
| 5,575,837 | 11/1996 | Kodama et al. | 106/3 |
| 5,622,896 | 4/1997 | Knotter et al. | 438/123 |
| 5,645,736 | 7/1997 | Allman | 216/89 |
| 5,770,095 | 6/1998 | Sasaki et al. | 216/38 |
| 5,783,489 | 7/1998 | Kaufman et al. | 438/692 |
| 5,804,513 | 9/1998 | Sakatani et al. | 438/693 |
| 5,827,781 | 10/1998 | Skrovan et al. | 438/697 |
| 5,860,848 | 1/1999 | Loncki et al. | 451/36 |

FOREIGN PATENT DOCUMENTS

| | | |
|---|---|---|
| 0 401 147 | 12/1990 | European Pat. Off. |
| 0 708 160 | 4/1996 | European Pat. Off. |
| 2 247 892 | 3/1992 | United Kingdom |
| WO 95 24054 | 9/1995 | WIPO |
| WO 96 16436 | 5/1996 | WIPO |

OTHER PUBLICATIONS

Cabot Corporation Semi–Sperse™ W–A355 Polishing Slurry for Tungsten CMP product literature Apr. 1995.

Cabot Corporation Semi–Sperse™ FE–10 Oxidizer Solution for Tungsten CMP product literature Apr. 1995.

Cabot Corporation General Information on Semi–Sperse™ W–A355 Polishing Slurry for Tungsten CMP product literature, Apr. 1995.

Patent Abstracts of Japan, publication No. 6342782, publication date Nov. 11, 1988.

Dupont Oxone® Monopersulfate Compound, Oxone Monopersulfate Compound, pp. 1–6 (1994).

*Primary Examiner*—Richard L. Raymond

[57] ABSTRACT

A method for polishing computer rigid disks comprising bringing at least one surface of the rigid disk into contact with a polishing pad and applying a dispersion to the rigid disk to give a polished rigid disk having an rms roughness less than about 1.4 nm. Also disclosed is a dispersion and polishing slurry for polishing rigid disks.

33 Claims, No Drawings

COMPOSITION AND METHOD FOR POLISHING RIGID DISKS

This application is a continuation-in-part of co-pending U.S. patent application Ser. No. 08/753,482, filed on Nov. 26, 1996.

BACKGROUND OF THE INVENTION

1. Field of the Invention

This invention concerns a method for polishing rigid disks (which are used for computer hard drives) using an aqueous dispersion of fine abrasive particles. The aqueous dispersion may be incorporated into a chemical mechanical polishing slurry including at least one oxidizer and an optional catalyst. More particularly the method of this invention is especially adapted for polishing electroless nickel deposited rigid disks.

2. Description of the Related Art

Great strides are being made in the miniaturization of electronic components for the computer and electronics industries. Miniaturization has created component quality concerns, many of which are resolved by the precise polishing of computer and electronic substrate materials for magnetic disks and semi-conductors. As a result, identifying methods and compositions that can produce an essentially defect free surface has become crucial in the manufacture of computer and electronic substrates.

The driving force for miniaturization in rigid disks is similar to that in the semiconductor industry. Customers are demanding continually increasing storage capacity in rigid disks. At the same time the design rules used by computer manufacturers call for smaller hard drives. The only solution available to rigid disk manufacturers is to increase the storage density of the magnetic media. The recent development of magneto-resistive head technology allows heads to "float" at less that 50 nm above the disc surface at rotation rates in excess of 5000 rpm. Therefore a quantum leap is needed in surface finish quality of rigid disks as measured by such parameters as rms roughness and defectivity in order to enhance the signal to noise ratio of finished rigid disks.

Dispersions and chemical mechanical polishing (CMP) slurries have been developed for use in conjunction with semi-conductor device manufacture. However, few of the commercially available dispersions or CMP slurries have been evaluated in rigid disk polishing applications. For example, U.S. Pat. No. 4,475,981 discloses a composition for polishing the metal surface of nickel plated blanks for rigid memory disks with a composition including ceric oxide or aluminum oxide powder, a water soluble chlorine-containing mild oxidizing agent and an aqueous suspension of colloidal alumina oxide or ceria oxide. U.S. Pat. Nos. 4,696,697 and 4,769,046, each disclose methods for polishing memory disks using an abrasive composition including alpha-aluminum oxide and a polishing accelerator such as nickel sulfate. The aluminum oxide polishing agent preferably has a minum particle size of 0.7–4 $\mu$m and a maximum particle size of 20 $\mu$m or less. U.S. Pat. Nos. 4,915,710 and 4,929,257 each disclose abrasive compositions suitable for polishing aluminum based substrates for magnetic recording disks. The composition disclosed includes an alumina abrasive, a polishing accelerator such as gluconic or lactic acid and colloidal alumina. In addition, U.S. Pat. No. 5,527,423 discloses an abrasive composition that is particularly useful in the method of this invention. Likewise, U.S. patent application Ser. No. 08/753,482, incorporated herein by reference, discloses a chemical mechanical abrasive composition including an oxidizer and a catalyst that is useful in the method of this invention.

Methods for polishing rigid disks are disclosed in U.S. Pat. Nos. 4,769,046, 5,084,071, and 5,441,788. U.S. Pat. No. 4,769,046 discloses a method for polishing a layer of nickel plated on a rigid disk using a composition comprising aluminum oxide and a polishing accelerator such as nickel nitrate, aluminum nitrate, or mixtures thereof. U.S. Pat. No. 5,084,071 discloses a method of chemical mechanical polishing and electronic component using a composition including abrasive particles that are not alumina, a transition metal chelated salt, a solvent for the salt, and a small but effective amount of alumina. Finally, U.S. Pat. No. 5,441,788 discloses a method for manufacturing a nickel phosphor recording disk including polishing the NiP substrate to a surface roughness to no less than 2.0 nm RMS.

The commercially available rigid disk polishing slurries are unable to meet the new rigid disk surface finish parameters. Furthermore, compositions that are presently known to be capable of polishing rigid disks are unable to polish rigid disks at a high rate and, at the same time, produce an acceptable surface finish. Therefore, there remains a need for dispersions, and chemical mechanical polishing slurries that are capable of polishing rigid or hard disks at high rates with low defectivity, while providdng a smooth surface finish.

SUMMARY OF THE INVENTION

The present invention is directed to a method for polishing rigid disks using a fine particulate dispersion alone, or incorporated into a chemical mechanical polishing slurry. The method of this invention is able to remove nickel phosphide from an aluminum alloy-based rigid disk at high rates while producing a rigid disk with an essentially defect free surface.

This invention is also a rigid disk polished by the method of this invention having an rms roughness less than about 1.4 nm and preferably less than about 1.0 nm.

The present invention is also a novel dispersion alone or in combination with at least one oxidizing agent and at least one catalyst that is useful for polishing computer rigid disks.

In one embodiment, this invention is a method for polishing a rigid disk. The method uses a dispersion comprising a metal oxide abrasive having a surface area ranging from about 5 $m^2/g$ to about 430 $m^2/g$, a particle size distribution less than about 1.0 micron, and a mean particle diameter less than about 0.4 microns and a pH of from about 2.0 to about 7.0. The dispersion is applied to at least one surface of the rigid disk and a polishing pad is moved into contact with the surface of the rigid disk. The polishing pad is moved in relation to the rigid disk to give a polished rigid disk having an rms roughness of less than 1.4 nm.

In another embodiment, this invention is a method for polishing a rigid disk having a first side and a second side. The method uses a chemical mechanical polishing slurry comprising a fumed alumina abrasive having a surface area ranging from about 5 $m^2/g$ to about 430 $m^2/g$, a particle size distribution less than about 1.0 micron, a mean particle diameter less than about 0.4 microns and a pH of about 2.0 to about 5.0, an iron catalyst, and from about 0.1 to about 10.0 weight percent of an oxidizing agent selected from the group consisting of hydrogen peroxide and monopersulfate wherein when the oxidizing agent is hydrogen peroxide, then the slurry includes from about 0.01 to about 0.20 weight percent ferric nitrate and when the oxidizing agent is monopersulfate, then the slurry includes from about 0.1 to about 0.5 weight percent ferric nitrate catalyst. The chemical mechanical polishing slurry is applied to the first surface and the second surface of the rigid disk. A first pad is moved into contact with the first surface and a second pad is moved into contact with the second surface, and the first pad and the second pad are moved in relation to the rigid disk to give a polished rigid disk having an rms roughness of less than 1.4 nm.

In yet another embodiment, this invention is a rigid disk polished by the methods of this invention having an rms roughness of less than about 1.4 nm, and preferably less than about 0.6 nm.

In still another embodiment, this invention is a dispersion comprising a metal oxide abrasive having a surface area ranging from about 5 $m^2/g$ to about 430 $m^2/g$, a particle size distribution less than about 1.0 micron, a mean particle diameter less than about 0.4 microns, and a pH of from about 2.0 to about 7.0. More particularly, this invention is a chemical mechanical polishing slurry incorporating the dispersion and one or more ingredients selected from an oxidizing agent, a metal catalyst, and additives.

DESCRIPTION OF THE CURRENT EMBODIMENT

The present invention relates to abrasive dispersion compositions of matter useful for polishing rigid disks comprising a fine dispersion having distinct particle characteristics. The present invention also relates to a method for polishing rigid disks using an abrasive dispersion alone or combined with specific additives including at least one oxidizer and, optionally, at least one catalyst to give a chemical mechanical polishing composition (CMP slurry) that promotes a chemical reaction between the oxidizer and the rigid disk metal layer. In particular, both the dispersion and the chemical mechanical polishing slurry are capable of polishing rigid disks at good rates to give polished rigid disks having excellent RMS roughness ranging from about less than 1.4 nm at polishing rates greater than about 1.5 $\mu$inch/min.

Before describing the details of the various preferred embodiments of this invention, some of the terms that are used herein will be defined. The term chemical mechanical polishing slurry as used herein, ("CMP slurry"), refers to the combination of at least one abrasive dispersion and at least one oxidizer.

The term "rigid disk" refers to rigid disks and hard disks, such as an aluminum disk or nickel phosphor (NiP) plated aluminum disk upon which a magnetic media for computer memories will be coated.

One aspect of this invention is method for polishing rigid disks using a dispersion of an abrasive with specific particle characteristics that has heretofore never been appreciated as being useful for polishing rigid disks. An abrasive useful in the dispersion of this invention is described in U.S. Pat. No. 5,527,423 which is incorporated herein by reference. The abrasive described in the '423 patent has well defined particle properties. The preferred metal oxide abrasive will have a surface area, as calculated from the method of S. Brunauer, P. H. Emmet, and I. Teller, J. Am. Chemical Society, Volume 60, Page 309 (1938) and commonly referred to as BET, ranging from about 5 $m^2/g$ to about 430 $m^2/g$, more preferably from about 20 $m^2/g$ to about 250 $m^2/g$, and most preferably from about 30 $m^2/g$ to about 100 $m^2/g$ when the abrasive is fumed alumina and about 40 $m^2/g$ to about 200 $m^2/g$ when the abrasive is fumed silica. Due to stringent purity requirements in the IC industry the preferred metal oxide should be of a high purity. High purity means that the total impurity content, from sources such as raw material impurities and trace processing contaminants, is typically less than 1% and preferably less than 0.01% (i.e., 100 ppm).

The metal oxide abrasive useful in the dispersion of this invention may consist of metal oxide aggregates or individual single sphere particles. The term "particle" as it is used herein refers to both aggregates of more than one primary particle and to single particles. The metal oxide particles useful in the methods and compositions of this invention will have a size distribution less than about 1.0 micron, a mean individual or aggregate diameter less than about 0.4 micron and a force sufficient to repel and overcome the van der Waals forces between the abrasive aggregates or individuals particles themselves. Such metal oxide abrasives have been found to be effective in minimizing or avoiding scratching, pit marks, divots and other surface imperfections during polishing of rigid disks. The particle size distribution in the present invention may be determined utilizing known techniques such as transmission electron microscopy (TEM). The mean particle diameter and mean refers to the average equivalent spherical diameter when using TEM image analysis, i.e., based on the cross-sectional area of the particle. By force is meant that either the surface potential or the hydration force of the metal oxide particles must be sufficient to repel and overcome the van der Waals attractive forces between the particles.

Preferably, the metal oxide abrasive is incorporated into the aqueous medium of the polishing slurry as a concentrated aqueous dispersion of metal oxides, which concentrated aqueous dispersion of metal oxide abrasives typically ranges from about 3% to about 45% solids, and preferably between 10% and 20% solids. The aqueous dispersion of metal oxides may be produced utilizing conventional techniques, such as slowly adding the metal oxide abrasive to an appropriate media, for example, deionized water, to form a colloidal dispersion. The dispersion is typically completed by subjecting it to high shear mixing conditions known to those skilled in the art.

The metal oxide abrasive may be selected from the group including alumina, titania, zirconia, germania, silica, ceria mixtures thereof and chemical admixtures thereof. The term "chemical admixture" refers to particles including atomically mixed or coated metal oxide abrasive mixtures. The dispersion useful in the method of this invention preferably includes from about 0.5 to about 55.0 weight percent or more of an abrasive. It is more preferred, however, that the dispersion and/or the CMP slurry of this invention is diluted at the point of use with deionized water or any other acceptable diluent to produce a dispersion with less than 12 wt %, preferably less than about 6.0 wt % abrasive when the abrasive is alumina, less than about 10.0 wt % abrasive when the abrasive is silica, and most preferably from about 3.0 to about 6.0 weight percent abrasive. The term "point of use" refers to the location where the dispersion is used which, in the case of a rigid disk, would be the surface of a rigid disk undergoing polishing.

The metal oxide abrasive may be produced by any techniques known to those skilled in the art to give abrasive particles having the characteristics reported above. Metal oxide abrasives can be derived from processes including flame processes, sol-gel processes, hydrothermal processes, plasma processes, aerogel processes, fuming processes, precipitation processes, mining, and by any combination of these processes.

For example, the production of fumed metal oxides is a well-known process which involves the hydrolysis of suitable feedstock vapor (such as aluminum chloride for an alumina abrasive) in a flame of hydrogen and oxygen. Molten particles of roughly spherical shapes are formed in the combustion process, the diameters of which are varied through process parameters. These molten spheres of alumina or similar oxide, typically referred to as primary particles, fuse with one another by undergoing collisions at their contact points to form branched, three dimensional chain-like aggregates. The force necessary to break aggregates is considerable and often considered irreversible. During cooling and collecting, the aggregates undergo further collision that may result in some mechanical entanglement to form agglomerates. Agglomerates are thought to be loosely held together by van der Waals forces and can be reversed, i.e., de-agglomerated, by proper dispersion in a suitable media.

Precipitated abrasives may be manufactured by conventional techniques such as by coagulation of the desired particles from an aqueous medium under the influence of high salt concentrations, acids or other coagulants. The particles are filtered, washed, dried and separated from residues of other reaction products by conventional techniques known to those skilled in the art.

The manufacture of gel based materials, e.g. aerogels, xerogels, hydrogels and other gels is well known to those skilled in the art and may be accomplished utilizing conventional techniques, for example, U.S. Pat. No. 3,652,214 to Aboutboul, et al., U.S. Pat. No. 2,188,007 to Kistler, and as disclosed in the article by Heley, et al., entitled *"Fine Low Density Silica Powders Prepared by Supercritical Drying of Gels Derived From Silicon Tetrachloride,"* Journal of Non-Crystalline Solids, 186, 30–36 (1955).

The metal oxide abrasives produced by the processes described above can be further processed by pulverization and crushing processes to give metal oxide abrasives that are useful in the methods and compositions of this invention. Useful pulverization and crushing processes include milling or grinding using conventional manufacturing techniques such as jet-milling, ball milling, bead milling, and other milling and pulverization techniques and process know to one skilled in the art.

Preferably, the metal oxide is a fumed or precipitated abrasive and, more preferably it is a fumed abrasive such as fumed silica or fumed alumina. Fumed alumina may be comprised of amorphous alumina, high temperature crystalline phases of alumina consisting of gamma, theta, delta, and alpha alumina, and low temperature phases of alumina consisting of all non-high temperature crystalline alumina phases.

It is preferred that the fumed alumina used in the compositions of this invention has a crystalinity of at least 40 weight percent. It is more preferred that the fumed alumina used in the present invention is greater than 90 weight percent crystalline, and that the fumed alumina consist of at least 80 weigh percent high temperature crystalline phases of alumina.

pH is an important parameter of the dispersion of this invention when it is used to polish hard disks. It is preferred that the dispersion has a pH from about 2.0 to about 7.0. Optimum hard disk polishing results are achieved when the aqueous polishing slurry pH ranges from about 2.0 to about 5.0. If necessary the pH % of the polishing slurry can be adjusted with suitable acids or bases, e.g., nitric acid, sodium hydroxide, HCl, etc. . . . .

Another aspect of this invention is a method for polishing rigid disks that uses a chemical mechanical composition that has heretofore never been appreciated as being useful for polishing rigid disks. A chemical mechanical composition useful for polishing rigid disks according to this invention includes an oxidizing agent and an optional catalyst. This chemical mechanical composition is useful when mixed with at least one abrasive to give a chemical mechanical polishing slurry that is useful for polishing rigid disks. The oxidizing agent—catalyst combinations disclosed herein are useful when incorporated into a CMP slurry or when used alone as a chemical mechanical composition in conjunction with an abrasive pad to polish metals and metal based components of rigid disks. Alternatively, the chemical mechanical polishing slurry of this invention may include a metal oxide abrasive and an oxidizing agent without a catalyst.

The chemical mechanical composition and slurry useful in this invention is disclosed in U.S. patent application Ser. No. 08/753,482 which is incorporated herein by reference. The useful chemical mechanical compositions includes at least one oxidizing agent. Suitable oxidizing agents include oxidizing metal salts, oxidizing metal complexes, nonmetallic oxidizing acids such as peracetic and periodic acids, iron salts such as nitrates, sulfates, EDTA, citrates, potassium ferricyanide, hydrogen peroxide, potassium dichromate, potassium iodate, potassium bromate, vanadium trioxide and the like, aluminum salts, sodium salts, potassium salts, ammonium salts, quaternary ammonium salts, phosphonium salts, or other cationic salts of peroxides, chlorates, perchlorates, nitrates, permanganates, persulfates and mixtures thereof.

When a catalyst is used in the composition and method of this invention, it is preferred that the oxidizing agent chosen have an electrochemical potential greater than the electrochemical potential necessary to oxidize the catalyst. For example an oxidizing agent having a potential of greater than 0.771 volts versus normal hydrogen electrode is necessary when a hexa aqua iron catalyst is oxidized from Fe(II) to Fe(III). If an aqua copper complex is used, an oxidizing agent having a potential of greater than 0.153 volts versus normal hydrogen electrode is necessary to oxidize Cu(I) to Cu(II). These potentials are for specific complexes only, and may change, as will the useful oxidizers, upon the addition of additives such as ligands (complexing agents) to the compositions of this invention.

The oxidizing agent is preferably an inorganic or organic per-compound. A per-compound as defined by *Hawley's Condensed Chemical Dictionary* is a compound containing at least one peroxy group (—O—O—) or a compound containing an element in its highest oxidation state. Examples of compounds containing at least one peroxy group include but are not limited to hydrogen peroxide and its adducts such as urea hydrogen peroxide and percarbonates, organic peroxides such as benzoyl peroxide, peracetic acid, and di-t-butyl peroxide, monopersulfates ($SO_5^=$), dipersulfates ($S_2O_8^=$), and sodium peroxide. Examples of compounds containing an element in its highest oxidation state include but are not limited to periodic acid, periodate salts, perbromic acid, perbromate salts, perchloric acid, perchloric salts, perboric acid, and perborate salts and permanganates. Examples of non-per compounds that meet the electrochemical potential requirements include but are not limited to bromates, chlorates, chromates, iodates, iodic acid, and cerium (IV) compounds such as ammonium cerium nitrate.

The most preferred oxidizing agents are hydrogen peroxide and its adducts, and monopersulfates. Monopersulfates are compounds which include the oxidizing $SO_5^=$ group as shown below.

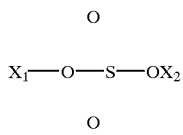

where $X_1$ and $X_2$ are each individually $H_1$, $Si(R')_3$, $NH_4$, $N(R'')_4$ and alkali earth metals such as Li, Na, K, and so forth; where R' is an alkyl group having from 1 to 10 or more carbon atoms, and wherein R" is H, an alkyl group, an aryl group, or mixtures thereof including, for example, $NMe_4$, $NBu_4$, $NPh_4$, $NMeBu_3$, $NHEt_3$ and so forth. One well known and preferred class of monopersulfates are combinations of $KHSO_5$, $KHSO_4$ and $K_2SO_4$. This combination is known as a triple salt.

The oxidizing agent may be present in a chemical mechanical polishing slurry in an amount ranging from about 0.01 to about 50.0 weight percent and preferably from about 0.01 to about 10.0 weight percent. It is preferred that the oxidizer is present in the slurry in an amount ranging from about 0.1 to about 5.0 weight percent when the oxidizing agent is a monopersulfate, and from about 0.2 to about 10.0 wt % when the oxidizing agent is a triple salt.

The useful chemical mechanical composition, of this invention includes at least one catalyst. The purpose of the catalyst is to transfer electrons from the metal being oxidized to the oxidizer (or analogously to transfer electrochemical current from the oxidizer to the metal). The catalyst or catalysts chosen may be metallic, non-metallic, or a combination thereof and the catalyst must be able to shuffle electrons efficiently and rapidly between the oxidizer and metal substrate surface. Preferably, the catalyst is chosen from metal compounds that have multiple oxidation states, such as but not limited to Ag, Co, Cr, Cu, Fe, Mo, Mn, Nb, Ni, Os, Pd, Ru, Sn, Ti and V. The term "multiple oxidation states" refers to an atom and/or compound that has a valence number that is capable of being augmented as the result of a loss of one or more negative charges in the form of electrons. Most preferred metal catalysts are compounds of Ag, Cu and Fe and mixtures thereof. Especially preferred are iron catalysts such as but not limited to inorganic salts of iron, such as iron (II or III) nitrate, iron (II or III) sulfate, iron (II or III) halides, including fluorides, chlorides, bromides, and iodides, as well as perchlorates, perbromates and periodates, and ferric organic iron (II or III) compounds such as but not limited to acetates, acetylacetonates, citrates, gluconates, oxalates, phthalates, and succinates, and mixtures thereof.

The catalyst may be present in the chemical mechanical polishing composition in an amount ranging from about 0.001 to about 2.0 weight percent. It is preferred that the catalyst will be present in the chemical mechanical polishing composition in an amount ranging from about 0.005 to about 0.5 weight percent. At this preferred catalyst loading level, i.e., 0.5 weight percent or less, and when a non-metallic oxidizing agent such as hydrogen peroxide, urea hydrogen peroxide or monopersulfate is used, the chemical mechanical polishing composition is essentially metal and "metallic ion free" in comparison to commercially available ferric nitrate based slurries.

The amount of catalyst used may vary depending upon the oxidizing agent used. When the preferred oxidizing agent hydrogen peroxide is used in combination with a preferred catalyst such as ferric nitrate, the catalyst will preferably be present in the composition in an amount ranging from about 0.01 to about 0.20 weight percent (approximately 7 to 280 ppm Fe in solution) and preferably from about 0.01 to about 0.05 weight percent ferric nitrate. When the preferred oxidizing agent is a triple salt of monopersulfate and a preferred catalyst such as ferric nitrate is used, the catalyst will be present in the composition in an amount ranging from about 0.05 to about 1.0 weight percent (approximately 70 to about 1400 ppm Fe in solution) and preferably from about 0.1 to about 0.5 weight percent.

The concentration ranges of catalyst in the chemical mechanical polishing slurry of this invention are generally reported as a weight percent of the entire compound. The use of high molecular weight metal containing compounds that comprise only a small percentage by weight of catalyst is well within the scope of catalysts in this invention. The term catalyst when used herein also encompasses compounds wherein the catalytic metal comprises less than 10% by weight of the metal in the composition and wherein the metal catalyst concentration in the CMP slurry is from about 2 to about 3000 ppm of the overall slurry weight.

The chemical mechanical composition may be combined with at least one abrasive to produce a CMP slurry. The abrasive may be any metal oxide abrasive. However, the metal oxide abrasive described above and in U.S. Pat. No. 5,527,423, disclosed herein by reference, are preferred.

Other well known polishing slurry additives may be incorporated alone or in combination into the chemical mechanical polishing slurry useful in the process of this invention. A non-inclusive list is inorganic acids, organic acids, surfactants, alkyl ammonium salts or hydroxides, and dispersing agents.

An additive which may be useful with this invention is one which stabilizes the oxidizer in the presence of the metal complex. It is well known that hydrogen peroxide is not very stable in the presence of many metal ions without the use of stabilizers. Useful stabilizers include phosphoric acid, organic acids (e.g., acetic, citric, tartaric, orthophthalic, and EDTA), tin oxides, phosphonate compounds and other ligands which bind to the metal and reduce its reactivity toward hydrogen peroxide decomposition. These additives can be used alone or in combination and significantly decrease the rate at which hydrogen peroxide decomposes, and may also effect tungsten polishing rates.

Metal surfaces such as nickel-plated blanks for rigid memory discs are polished with the above described compositions by subjecting the surface to mechanical rubbing (polishing) in the presence of the composition. The rubbing effects mechanical smoothing or wear of the surface which is aided by the abrasive, and when present, promoted by the components added to the abrasive to give a chemical mechanical polishing slurry which chemically attacks and dissolves the components comprising the disk metal surface. Polishing may thus by achieved solely by a mechanical mechanism, or by a combination of chemical and mechanical mechanisms.

The mechanical rubbing or polishing is conveniently effected by contacting one or both of the rigid disk surfaces with polishing pads under a predetermined compressive force with relative motion between the pad and the surface. The resulting dynamic friction between the pad and the surface causes the desired wear and smoothing of the disk surface. The relative motion is preferably achieved through rotation of either or both the disk surface and the pad. Commercially available polishing pads that are used to polish glass or wafers in the electronics industry may be used. These pads are typically composed of a microporous polymer such as polyurethane foam, optionally backed with a substrate such as felt, latex filled felt, dense polyurethane, or latex. The coefficients of friction of the surfaces of those pads vary and it is within the scope of the invention to carry out the process using a multiplicity of stages (e.g., rough polish followed by a finish polish) using pads having different coefficients of friction. For instance when the process involves a rough polish stage followed by a finish polish stage, the pad used in the finish polish stage has a lower coefficient of friction than the pad used in the rough polish stage.

The polishing machines that are used to polish silicon wafers and the like in the electronics industry may be adapted for use in polishing the plated rigid disc blanks. These machines basically consist of a pair of platens. One of the platens carries a rack on which one or more rigid discs may be mounted. The other platen carries a driven rotable plate on which the polishing pad is mounted. The machine includes means for controlling the pressure between the platens, means for controlling the temperature of the platens, and means for injecting one or more fluids into the interface between the platens.

Rigid disk polishing can be accomplished in one or two steps. In the first step, an abrasive dispersion or chemical mechanical polishing slurry is applied to the rigid disk surface with a pad in order to quickly remove a portion of the disk surface layer by mechanical abrasion to give a rigid disk with an abraded surface. In the second step, the surface of the rigid disk is polished to the desired RMS value. The second step can be accomplished by using a dispersion of CMP slurry of this invention alone.

In a preferred method, rigid disk blanks having a first surface and a second surface are mounted on one platen and the desired polishing pads are located adjacent to the disk surfaces. The platens are brought together while the polishing pads are rotated, typically at about 40 to 80 rpm, more usually about 55 to 65 rpm. A dispersion, chemical mechanical composition or CMP slurry is applied to the interface between the pad and rigid disk via a fluid injecting means or by applying the composition to the pad or rigid disk prior to bringing the pad into contact with the disk surface. A preferred fluid injecting means is configured so that fluid is injected both at the center and midpoint of the rigid disc blank. The suspension lubricates the interface and the abrasive aids in the mechanical polishing of the disk's surfaces. The pressure on the material located between the platens during this stage of the process is usually in the range of about 0.75 to about 3.0 psi more usually about 0.75 to 1.8 psi. The polishing in this stage is essentially mechanical. The duration of this first stage of polishing will usually be in the range of 1 to 10 min, more usually 4 to 6 min. Following this first stage, a second suspension comprising a dispersion, chemical mechanical composition, or CMP slurry of this invention is applied to the pad/disk interface. Components of the CMP slurry of this invention preferably chemically attacks the rigid disk surface. Thus, the polishing in the second stage is preferably both mechanical and chemical. The pressure on the material between the platens in the second stage will usually be in the range of about 1.5 to about 1.8 psi. The duration of the second stage polishing will usually be about 1 to 10 min, more usually 1 to 2 min. The temperature is maintained in a range of about 10° C. to about 45° C., preferably about 25° C. to about 35° C. throughout both stages. When the polishing is completed the platens are separated and the plated rigid disc blanks are removed and washed with deionized water. The rigid discs may then be subjected to various post-polishing steps such as texturing and application of the ferromagnetic thin film.

Rigid disks polished using the methods and compositions of this invention have very little defectivity. The disks are flat and they have very little roughness, i.e., a fine, smooth surface finish. Rigid disks polished with the composition of this invention have a surface roughness typically no greater than 1.4 nm. The dispersion and chemical mechanical polishing slurries useful in the methods of this invention are able to polish rigid disks to rms roughness of from about 0.1 to less than about 1.4 nm and more preferably from about 0.1 to less than about 0.7 nm.

Rigid discs polished using the methods and compositions of this invention are also polished at high rates of greater than about 1.5 μinch/min, and preferably greater than about 2.5 μinch/min.

EXAMPLES

We have discovered compositions that are capable of polishing rigid disks at high rates and with low resulting defectivity.

The following examples illustrate preferred embodiments of this invention as well as preferred methods of this invention.

Example 1

Rigid disks were polished in the following examples with various abrasive dispersions and chemical mechanical polishing slurries using the following method. The rigid disks used were commercially available nickel/phosphor coated disks with aluminum substrates. The disks used in these experiments had all undergone a pre-polishing.

The NiP coated aluminum rigid disks were polished in a table top polishing machine manufactured by Streuers, West Lake, Ohio. The table top polishing machine consisted of a Rotopol 31 base and a Rotoforce 3 downforce unit. Twelve inch Polytex Supreme pads, manufactured by Rodel, Inc. were used to polish the rigid disks in each example.

The rigid disks were polished for 10 minutes per side using a platen speed of 150 rpm, and polisher carrier speed of 100 rpm, and a slurry flow rate of 100 ml/min. The polishing down force used was 1.58 psi.

Removal rates were calculated by weighing the clean, dry rigid disk prior polishing and following polishing and converting the weight loss to a thickness loss using a NiP density of 8.05.

The alumina used in Examples 2 and 4 below was EPDSK-1000 manufactured by Cabot Corporation Microelectronics Materials Division in Aurora, Ill. and was diluted with deionized water. The silica used in Examples 2 and 3 was 90 m²/g fumed silica dispersion manufactured by Cabot Corporation, Tuscola, Ill.

Example 2

This example evaluates the effect of dispersion pH on NiP rigid disk polishing rates. Dispersions with pHs and solid contents set forth in table 1 below. The NiP polishing rates of is also summarized in Table 1.

TABLE 1

| Slurry | Abrasive | Solids (wt %) | pH | Rate (μinch/min) |
|---|---|---|---|---|
| 1 | alumina | 1.5% | 2.2 | 3.0 |
| 2 | alumina | 1.5% | 3.5 | 2.8 |

TABLE 1-continued

| Slurry | Abrasive | Solids (wt %) | pH | Rate (µinch/min) |
|---|---|---|---|---|
| 3 | alumina | 2.0% | 7.0 | 1.5 |
| 4 | silica | 5.0% | 2.2 | 3.6 |
| 5 | silica | 5.0% | 4.0 | 1.6 |
| 6 | silica | 5.0% | 5.0 | 1.5 |

The polishing results indicate that good polishing rates are achieved using a low pH dispersion, and that polishing rates decrease with increasing dispersion pH.

Example 3

This experiment evaluated the ability of silica dispersions, alone, and with additives to polish NiP coated aluminum rigid disks. The method set forth in Example 1 was used to polish the rigid disks. The slurries used, the polishing rates achieved, and the rms roughness achieved are reported in Table 2 below.

TABLE 2

| Slurry # | Abrasive | Solids | Oxidizer | Catalyst | pH | Rate (µinch/min) | rms |
|---|---|---|---|---|---|---|---|
| 1 | silica | 5.0% | NA | NA | 2.5 | 3.4 | 0.35 nm |
| 2 | silica | 5.0% | 1.0% Oxone | NA | 2.5 | 2.9 | NA |
| 3 | silica | 5.0% | 1.0% Oxone | 0.1% Ferric Nitrate | 2.5 | 8.4 | 0.27 nm |
| 4 | silica | 5.0% | 5.0% Hydrogen Peroxide | 0.035% Ferric Nitrate | 2.5 | 4.8 | NA |

The source of monopersulfate used in this Example is Oxone® manufactured by DuPont. Oxone® consist of the triple salt: 2KHSO$_5$ . . . KHSO$_4$ . . . K$_2$SO$_4$, and is approximately 50% monopersulfate by weight.

Good NiP polishing rates (above 2.5 µ inch/min) were achieved with dispersions and slurries containing a silica abrasive. The addition of 1.0% OXONE® (potassium triple salt) and 0.1% ferric nitrate provided an outstanding NiP removal rate of 8.4 µinch/min. This is more than triple the rate achieved by silica a 5.0 wt % silica dispersion alone. Rms surface roughness of the polished disks, as determined by atomic force microscope, appears to be significantly reduced through the use of a silica abrasive. The rms surface roughness achieved with slurry 3 above was 0.27 nm.

Example 4

This experiment evaluated the ability of alumina dispersions, alone, and with additives to polish NiP coated aluminum rigid disks. The method set forth in Example 1 was used to polish the rigid disks. The slurries used, the polishing rates achieved, a the rms roughness achieved are reported in Table 3 below.

TABLE 3

| Slurry # | Abrasive | Solids | Oxidizer | pH | Rate (µinch/min) | rms roughness |
|---|---|---|---|---|---|---|
| 1 | alumina | 1.5% | NA | 3.5 | 2.8 | 0.45 nm |
| 2 | alumina | 1.5% | 5.0% Oxone | 2.2 | 13.6 | 0.60 nm |
| 3 | alumina | 1.5% | 1.0% Ferric Nitrate | 2.0 | 12.0 | 0.59 nm |
| 4 | alumina | 1.5% | 5% hydrogen peroxide | 3.0 | 5.1 | 0.34 nm |
| 5 | alumina | 1.5% | 5% urea hydrogen peroxide | 3.5 | 4.4 | 0.43 nm |

Good NiP polishing rates were achieve using an alumina dispersion alone (slurry 1). Improved NiP polishing rates were achieved with slurries including various oxidizers. Slurries 1 and 5 produced polished rigid disks with excellent rms roughness.

It is apparent from the examples above that the abrasive dispersions and polishing slurries useful in the present invention polish rigid disks at high polishing rates to give a smooth rigid disk surface with low defectivity.

While the present invention has been described by means of specific embodiments, it will be understood that modifications may be made without departing from the spirit of the invention. The scope of the invention is not to be considered as limited by the description of the invention set forth in the specification and examples, but rather as defined by the following claims.

For example, although the examples above have described polishing rigid disks with CMP slurries comprising metal catalysts, it is to be understood that non-metal catalysts having multiple oxidation states may be incorporated into useful CMP compositions and slurries that are useful in the methods of this invention.

What we claim is:

1. A method for polishing a rigid disk comprising the steps of:

(a) providing a dispersion comprising a metal oxide abrasive, at least one oxidizing agent, and at least one catalyst having multiple oxidation states;

(b) applying the dispersion to at least one surface of the rigid disk; and (c) removing at least a portion of a metal layer from the rigid disk by bringing a pad into contact with the surface of the rigid disk and moving the pad in relation to the rigid disk.

2. The method according to claim 1 wherein the dispersion is an aqueous dipsersion the metal oxide abrasive.

3. The method according to claim 1 wherein the dispersion includes from about 0.5 wt % to about 55 wt % of at least one metal oxide abrasive selected from alumina, titania, zirconia, germania, silica, ceria, silica, mixtures thereof, and chemical admixtures thereof.

4. The method according to claim 3 wherein the metal oxide abrasive is selected from fumed abrasives, sol-gel abrasives, hydrothermal derived abrasive, plasma process derived abrasives, flame derived abrasives, aerogel derived abrasives, precipitated abrasives, mined abrasives, or combinations thereof.

5. The method according to claim 4 wherein the metal oxide abrasive used in the dispersion is processed by a method selected from the group consisting of milling, grinding, jet-milling, ball milling, bead milling and combinations thereof prior to incorporating the metal oxide abrasive in the dispersion.

6. The method according to claim 5 wherein the metal oxide abrasive is fumed alumina, fumed silica, or mixtures thereof.

7. The method according to claim 6 wherein the metal oxide is fumed alumina having a crystalinity greater than about 40 weight percent.

8. The method according to claim 6 wherein the metal oxide abrasive is fumed alumina that is greater than 90 weight percent crystalline and comprised of greater than 80 weight percent high temperature crystalline phases of alumina.

9. The method according to claim 6 wherein the fumed alumina and fumed silica has a surface area ranging from about 20 m$^2$/g to about 250 m$^2$/g and is present in the dispersion in an amount less than about 12.0 wt %.

10. The method according to claim 6 wherein the fumed alumina has a surface area of from about 30 m$^2$/g to about 100 m$^2$/g and is present in the dispersion in an amount less than about 6.0 wt %.

11. The method according to according to claim 6 wherein the fumed silica has a surface area of from about 40 m$^2$/g to about 200 m$^2$/g and is present in the dispersion in an amount less than about 10.0 wt %.

12. The method according to claim 1 wherein the oxidizing agent is selected from oxidizing metal salts, oxidizing metal complexes, nonmetallic oxidizing acids, iron salts, potassium ferricyanide, hydrogen peroxide, potassium dichromate, potassium iodate, potassium bromate, vanadium trioxide, aluminum salts, sodium salts, potassium salts, ammonium salts, quaternary ammonium salts, phosphonium salts, cationic salts of peroxides, chlorates, perchlorates, nitrates, permanganates, persulfates, and mixtures thereof.

13. The method according to according to claim 12 wherein the oxidizing agent is ferric nitrate, potassium ferricyanide, potassium iodate, or mixtures thereof.

14. The method according to claim 1 wherein the oxidizing agent is an organic per compound, an inorganic per compound, a non-per compound, iodic acid, cerium (IV) compounds, or mixtures thereof.

15. The method according to claim 14 wherein the oxidizing agent is a monopersulfate, persulfate, peroxide, periodate or mixtures thereof.

16. The method according to claim 15 wherein the oxidizing agent is at least one monopersulfate having the formula:

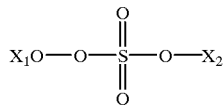

where X$_1$, X$_2$ are each individually H, Si(R')$_3$, NH$_4$, N(R")$_4$ and alkali earth metals such as Li, Na, K; where R' is an alkyl group having from 1 to 10 or more carbon atoms; and wherein R" is H, an alkyl group, an aryl group, or mixtures thereof.

17. The method according to claim 16 wherein the oxidizing agent is from about 0.1 to about 5.0 weight percent monopersulfate.

18. The method according to claim 16 wherein the oxidizing agent is from about 0.2 to about 10.0 weight percent 2KHSO$_5$.KHSO$_4$.K$_2$SO$_4$.

19. The method of claim 6 wherein the metal oxide is fumed silica.

20. The method according to claim 1 wherein the oxidizing agent is hydrogen peroxide.

21. The method according to claim 20 wherein the oxidizing agent is from about 0.1 to about 50 weight percent hydrogen peroxide.

22. The method according to claim 21 wherein the oxidizing agent is from about 0.1 to about 10.0 weight percent hydrogen peroxide.

23. The method of claim 22 wherein the metal oxide abrasive is fumed alumina.

24. The method according to claim 1 wherein the oxidizing agent has an electrochemical potential greater than the electrochemical potential necessary to oxidize the catalyst.

25. The method according to claim 24 wherein the metal catalyst is a compound of Ag, Co, Cr, Cu, Fe, Mo, Mn, Nb, Ni, Os, Pd, Ru, Sn, Ti, V or mixtures thereof having multiple oxidation states.

26. The method according to claim 25 wherein the metal catalyst is a compound of iron, copper, silver, or any combination thereof having multiple oxidation states.

27. The method according to claim 26 wherein the metal catalyst is an iron catalyst selected from the group consisting of inorganic iron compounds or organic iron compounds having multiple oxidation states.

28. The method according to claim 26 wherein the iron catalyst is ferric nitrate.

29. A method comprising the dispersion of claim 1, wherein the catalyst is present in the dispersion in an amount ranging from about 0.001 to about 2.0 weight percent.

30. The method according to claim 1 wherein the dispersion includes a monopersulfate oxidizing agent and from about 0.005 to about 1.0 weight percent of an iron catalyst.

31. The method according to claim 1 wherein the rigid disk has a first side, and a second side, and wherein a first pad including the aqueous dispersion is applied to the first side and a second pad including the aqueous dispersion is applied to the second side and the first and second pads are moved in relationship to the rigid disk.

32. A method for polishing a rigid disk having a first side and a second side comprising the steps of:
(a) providing an chemical mechanical polishing slurry comprising a fumed alumina abrasive having a surface area ranging from about 5 m$^2$/g to about 430 m$^2$/g, a particle size distribution less than about 1.0 micron, and a mean particle diameter less than about 0.4 microns an iron catalyst and from about 1.0 to about 10.0 weight percent of an oxidizing agent selected from the group consisting of hydrogen peroxide and monopersulfate wherein when the oxidizing agent is hydrogen peroxide, then the slurry includes from about 0.01 to about 0.05 weight percent ferric nitrate catalyst and when the oxidizing agent is monopersulfate, then the slurry includes from about 0.1 to about 0.5 weight percent ferric nitrate catalyst, and wherein the chemical mechanical polishing slurry has a pH of from about 2.0 to about 5.0;
(b) applying the chemical mechanical polishing slurry to the first surface and the second surface of the rigid disk; and
(c) removing at least a portion of a metal layer from the rigid disk first surface and the rigid disk second surface by bringing a first pad into contact with the first surface and bring a second pad into contact with the second surface and moving the first pad and the second pad in relation to the rigid disk to remove material form the surface of the rigid disk at a rate greater than about 1.5 μinch/min to give a polished rigid disk surface having an rms roughness of less than 1.4 nm.

33. A rigid disk prepared by the method of claim 32 having an rms roughness of from about 0.1 to about 0.7 nm.

* * * * *